United States Patent
Katou

(10) Patent No.: US 7,367,004 B2
(45) Date of Patent: Apr. 29, 2008

(54) CROSSTALK ERROR CONTROL APPARATUS, METHOD, AND PROGRAM

(75) Inventor: Shinichi Katou, Tokyo (JP)

(73) Assignee: NEC Corporation, Tokyo (JP)

( * ) Notice: Subject to any disclaimer, the term of this patent is extended or adjusted under 35 U.S.C. 154(b) by 100 days.

(21) Appl. No.: 11/368,467

(22) Filed: Mar. 7, 2006

(65) Prior Publication Data

US 2006/0206844 A1    Sep. 14, 2006

(30) Foreign Application Priority Data

Mar. 8, 2005    (JP)    ............... 2005-064629

(51) Int. Cl.
G06F 17/50    (2006.01)
(52) U.S. Cl. ............................. 716/5; 716/6
(58) Field of Classification Search .............. 716/4–6
See application file for complete search history.

(56) References Cited

U.S. PATENT DOCUMENTS

| | | | |
|---|---|---|---|
| 6,971,076 B2 * | 11/2005 | Chen | 716/4 |
| 7,024,337 B2 * | 4/2006 | Yoda | 702/183 |
| 7,086,018 B2 * | 8/2006 | Ito | 716/4 |
| 2006/0117289 A1 * | 6/2006 | Katagiri | 716/13 |

FOREIGN PATENT DOCUMENTS

| JP | 5-342305 A | 12/1993 |
|---|---|---|
| JP | 7-154231 A | 6/1995 |
| JP | 2002-259480 A | 9/2002 |

* cited by examiner

*Primary Examiner*—Jack Chiang
*Assistant Examiner*—Binh Tat
(74) *Attorney, Agent, or Firm*—Sughrue Mion, PLLC

(57) ABSTRACT

A crosstalk error controller includes a crosstalk analyzer for detecting a crosstalk error net in which a crosstalk error has occurred, a noise source detector for detecting noise source nets being noise sources to the crosstalk error net, and a reducing unit for lowering a signal level of a noise source net to thereby suppress the crosstalk error in the crosstalk error net. It is therefore possible for a crosstalk error controller to control a crosstalk error even if the wiring density is high.

30 Claims, 6 Drawing Sheets

CROSSTALK ERROR CONTROL APPARATUS, METHOD, AND PROGRAM

BACKGROUND OF THE INVENTION

1. Field of the Invention

The present invention relates to a layout designing method for designing a layout of a logic circuit such as a Large-Scale Integrated (LSI) circuit and a Printed Wiring Board (PWB) or a layout of logical connection in such a logic circuit, and in particular, to a crosstalk error control apparatus, a crosstalk error control method, and a crosstalk error control program to suppress a crosstalk error.

2. Description of the Prior Art

When a wiring pitch is large in the designing of a layout of a logic circuit in an LSI circuit or a PWB or a layout of logical connection of such a logic circuit, it is not required to pay attention to influence of crosstalk due to adjacent wiring lines.

However, since the wiring patterns of the LSI circuit and the PWB become finer, the wiring pitch is decreased. Hence the influence of the crosstalk cannot be neglected. Therefore, in the layout designing of logical circuits in the LSI circuit and the PWB as well as the logical connection in such logical circuits, the influence of the crosstalk must be considered. The crosstalk error has been suppressed as below.

For example, according to a first crosstalk error suppress control scheme, when allocation of a wiring pattern is finished, a crosstalk analysis is carried out based on a result of the wiring pattern allocation. The analysis includes, for example, calculation of a quantity of crosstalk between adjacent wiring lines. On the basis of a result of the crosstalk analysis, a net in which a crosstalk error occurs and a wiring pattern of a net having led to occurrence of the crosstalk are corrected to thereby suppress an event of the crosstalk.

According to a second crosstalk error suppress control scheme, in the designing of a wiring pattern, a line length is controlled for a wiring path or route of each net. That is, the length of parallel linear parts of the wiring path is bounded to thereby suppress crosstalk errors.

For example, Japanese Patent Application Laid-open No. 2002-259480 describes a crosstalk avoiding method. The method aims to avoid a crosstalk taking place at simultaneous transition of signals between adjacent inter-cell wiring lines to verify timing of a semiconductor integrated circuit including a plurality of nets in which a driver cell and a driven cell are connected by an inter-cell wiring line to each other. The method includes an extraction step to receive as inputs thereto a net list containing information regarding the nets, timing information including rising and falling information of output signals from each of the driver cells, and reference value information including a driving performance ratio reference value of the driver cell between nets whose wiring lines are adjacent to each other. In the extraction step, according to the timing information, candidate networks for victims (networks in which a crosstalk occurs or in which a crosstalk has occurred) and aggressors (networks causing a crosstalk) are extracted from the net list. The method further includes a calculation step to calculate an output signal waveform from each driver cell of the victims and the aggressors and a determination step of calculating, according to the output signal waveforms, a driving performance ratio between both driver cells, comparing the ratio with the reference value, and determining as a result whether or not the driving performance ratio must be corrected. The method also includes a correction step of determining, if the determination step has asserted that the ratio must be corrected, the driving performance of each of the driver cells of the victims and the aggressors so that the ratio matches with the reference value. As a result, even when an optimal solution cannot be obtained only by changing the driving performance of the driver cells of the victims, optimal driving performance is automatically set to reduce the delay variation due to the crosstalk.

Japanese Patent Application Laid-Open No. 5-342305 describes a crosstalk verification apparatus to automatically verify presence or absence of places where crosstalk likely occurs. The apparatus includes a first allocating or assigning unit to allocate layout pattern data indicating a verification layout pattern to be verified, a second allocating unit to allocate a design rule regarding the verification layout pattern, and a first storage means to store a first criterion for transistor's size that possibly exerts influence of crosstalk and a second criterion regarding transistor's size that is likely affected by crosstalk. The apparatus further includes a first extraction unit connected to the first and second allocating units and the first storage means to process the layout pattern data by referring to the design rule and the first and second criteria. From the transistors of the verification layout pattern, the first extraction module obtains transistors satisfying the first criterion and those satisfying the second criterion. For the selected transistors, the module extracts data of output wiring patterns from the layout pattern data. The apparatus also includes a second storage means to store a third criterion for magnitude of crosstalk noise, a second extraction unit connected to the first extraction unit and the second storage means, and a display connected to the second extraction unit to visually present error positions. The second extraction module calculates according the data of the output wiring pattern, inter-wiring capacity in an overlapped/parallel section between output wiring of each transistor satisfying the first criterion and output wiring of each transistor satisfying the second criterion to obtain, according to the capacity, magnitude of crosstalk noise taking place at each of the rising and the falling of an output signal from the transistor satisfying the second criterion. If the magnitude exceeds the third criterion, the second extraction unit extracts the overlapped/parallel section as an error position.

Japanese Patent Application Laid-Open No. 7-154231 describes a semiconductor integrated circuit including an output circuit in which an internal logic is inserted between a power supply terminal and a ground terminal, and a p-channel MOS transistor and an n-channel MOS transistor are connected in parallel with the internal logic. The output port of the internal logic is connected to gate electrodes of the p-channel and n-channel MOS transistors. The p-channel MOS transistor includes a power supply line connected to a plurality of voltage-drop diodes in a forward direction and in series to lower a high-level output voltage from a Complementary Metal Oxide Semiconductor (CMOS) IC to thereby suppress occurrence of emission noise and crosstalk noise.

However, according to the first crosstalk error suppression control, the crosstalk error cannot be sufficiently removed or suppressed only through the wiring correction in some cases, depending on the density of the wiring of the net in which a crosstalk error has occurred or a net adjacent to the error occuring net. When the wiring is changed to a considerable extent, there exists a fear that the change influences crosstalk noise and path delay in other wiring lines. It is required in such a case to again carry out the wiring correction depending on cases.

For the second crosstalk error suppression control which the gives the condition that any two linear sections of the wiring path do not run parallel beyond a certain length, it is not possible to fully remove or suppress the crosstalk error depending on the wiring density. There also likely exists a case in which the wiring arrangement includes unnecessary bending sections and detours, which thereby deteriorate the wiring layout.

In Japanese Patent Application Laid-open No. 2002-259480, by correcting the driving performance of each driver cell of a victim (a net in which a crosstalk has occurred) and an aggressor (a net having caused the crosstalk), the waveform variation of the output signal waveform on the victim side is reduced to thereby avoid a timing error due to the delay variation caused by the crosstalk. However, consideration has not been given to control of the signal level of the aggressor.

The gist of the technique of Japanese Patent Application Laid-Open No. 5-342305 resides in the automatic verification of presence or absence of places where crosstalk likely occurs, and hence attention has not been given to the suppression of the crosstalk error.

According to Japanese Patent Application Laid-Open No. 7-154231, the CMOS IC of which the output voltage is less than the power supply voltage suppresses the crosstalk noise. However, like Japanese Patent Application Laid-open Nos. 2002-259480 and 5-342305, consideration has not been given to the suppression of the crosstalk error.

SUMMARY OF THE INVENTION

It is therefore an object of the present invention to provide a crosstalk error control apparatus, a crosstalk error control method, and a crosstalk error control program capable of suppressing the crosstalk error even when the wiring is arranged at high density.

To achieve the object, the present invention has aspects as below.

In accordance with the present invention, there is provided a crosstalk error control apparatus including a crosstalk analyzing unit for detecting a crosstalk error net in which a crosstalk error has occurred, a noise source detector for detecting noise source nets being a noise source to the crosstalk error net, and a reducing unit for lowering a signal level of a noise source net. With this configuration, the apparatus suppresses the crosstalk error in the crosstalk error net.

In the crosstalk error control apparatus, the noise source net detector detects noise source nets in a descending order of noise quantities.

The crosstalk error control apparatus further includes a wiring allocation unit for executing re-wiring processing in a periphery of the noise source net of which the signal level is lowered by the reducing unit.

The crosstalk error control apparatus further includes a release unit for restoring to an original signal level the signal level of the noise source net lowered by the reducing unit.

The crosstalk error control apparatus also includes a delay analyzing unit for determining whether or not a delay error occurs in a path of a net affected by the lowering of the signal level of the noise source net and an analysis unit for determining whether or not a crosstalk error occurs in the noise source net of which the signal level is lowered. The wiring allocation unit executes, if the delay analyzing unit determined that the delay error has not occurred in the path and the analysis module determines that the crosstalk error has not occurred, the re-wiring processing in a periphery of the noise source net of which the signal level is lowered.

The crosstalk error control apparatus further includes a delay analyzing unit for determining whether or not a delay error occurs in a path of a net affected by the lowering of the signal level of the noise source net and a analysis module for determining whether or not a crosstalk error occurs in the noise source net of which the signal level is lowered. The release unit restores, in at least one of the case in which the delay analyzing unit determines that the delay error does not occur in the path and the case in which the analysis module determines that the crosstalk error does not occur, the signal level of the noise source net to an original signal level.

In the crosstalk error control apparatus, wherein the reducing module provisionally changes a function block of the noise source net thus detected and lowers a signal level of the noise source net.

In the crosstalk error control apparatus, the delay analyzing unit determines whether or not a delay value in the path of a net affected by the lowering of the signal level of the noise source net exceeds a predetermined delay limit value and determines, if the delay value of the path in the net exceeds the predetermined delay limit value, that a delay error has occurred in the path of the net.

Also in the crosstalk error control apparatus, the crosstalk analyzing unit determines, if a value of a crosstalk quantity obtained by analyzing a net exceeds a predetermined crosstalk quantity limit value, that a crosstalk error has occurred in the net and detects a crosstalk error net in which the crosstalk error has occurred.

In the crosstalk error control apparatus, the analysis module determines, if a value of a crosstalk quantity obtained by analyzing a net does not exceeds a predetermined crosstalk quantity limit value, that a crosstalk error has not occurred in the net.

In accordance with the present invention, there is provided a crosstalk error control method for an information processing apparatus controlling a crosstalk error. The method includes a crosstalk analyzing step of detecting a crosstalk error net in which a crosstalk error has occurred, a noise source detecting step of detecting noise source nets being noise sources of the crosstalk error net, and a reducing step of lowering a signal level of a noise source net. The steps are executed by the information processing apparatus to thereby suppress the crosstalk error in the crosstalk error net.

In the crosstalk error control method, the noise source net detecting step includes detecting noise source nets in a descending order of noise quantities.

The crosstalk error control method further includes a wiring allocation step of executing re-wiring processing in a periphery of the noise source net of which the signal level is lowered by the reducing step.

The crosstalk error control method further includes a release step of restoring to an original signal level the signal level of the noise source net lowered by the reducing step.

The crosstalk error control method further includes a delay analyzing step of determining whether or not a delay error occurs in a path of a net affected by the lowering of the signal level of the noise source net and an analysis step of determining whether or not a crosstalk error occurs in the noise source net of which the signal level is lowered. The steps are executed by the information processing apparatus. The wiring allocation step executes, if the delay analyzing step determines that the delay error has not occurred in the path and the analysis step determines that the crosstalk error has not occurred, the re-wiring processing in a periphery of the noise source net of which the signal level is lowered.

The crosstalk error control method further includes a delay analyzing step of determining whether or not a delay error occurs in a path of a net affected by the lowering of the signal level of the noise source net and an analysis step of determining whether or not a crosstalk error occurs in the noise source net of which the signal level is lowered. The steps are executed by the information processing apparatus. The release step restores, in at least one of the case in which the delay analyzing step determines that the delay error does not occur in the path and the case in which the analysis step determines that the crosstalk error does not occur, the signal level of the noise source net to an original signal level.

In the crosstalk error control method, the reducing step provisionally changes a function block of the noise source net thus detected and lowers a signal level of the noise source net.

In the crosstalk error control method, the delay analyzing step determines whether or not a delay value in the path of a net affected by the lowering of the signal level of the noise source net exceeds a predetermined delay limit value and determines, if the delay value of the path in the net exceeds the predetermined delay limit value, that a delay error has occurred in the path of the net.

Also in the crosstalk error control method, the crosstalk analyzing step determines, if a value of a crosstalk quantity obtained by analyzing a net exceeds a predetermined crosstalk quantity limit value, that a crosstalk error has occurred in the net and detects a crosstalk error net in which the crosstalk error has occurred.

In the crosstalk error control method, the analysis step determines, if a value of a crosstalk quantity obtained by analyzing a net does not exceeds a predetermined crosstalk quantity limit value, that a crosstalk error has not occurred in the net.

In accordance with the present invention, there is provided a crosstalk error control program to be executed in an information processing apparatus controlling a crosstalk error. The program includes crosstalk analyzing processing for detecting a crosstalk error net in which a crosstalk error has occurred, noise source detecting processing for detecting noise source nets being noise sources to the crosstalk error net, and reducing processing for lowering a signal level of a noise source net. The processing is executed by the information processing apparatus to thereby suppress the crosstalk error in the crosstalk error net.

In the crosstalk error control program, the noise source net detecting processing detects noise source nets in a descending order of noise quantities.

The crosstalk error control program further includes wiring allocation processing of executing re-wiring processing in a periphery of the noise source net of which the signal level is lowered by the reducing step. The wiring allocation processing is executed by the information processing apparatus.

The crosstalk error control program further includes reduction release processing for restoring to an original signal level the signal level of the noise source net lowered by the reducing processing.

The crosstalk error control program further includes delay analyzing processing of determining whether or not a delay error occurs in a path of a net affected by the lowering of the signal level of the noise source net and analysis processing of determining whether or not a crosstalk error occurs in the noise source net of which the signal level is lowered. The processing is executed by the information processing apparatus. The wiring allocation processing executes, if the delay analyzing processing determines that the delay error has not occurred in the path and the analysis processing determines that the crosstalk error has not occurred, the re-wiring processing in a periphery of the noise source net of which the signal level is lowered.

The crosstalk error control program further includes delay analyzing processing of determining whether or not a delay error occurs in a path of a net affected by the lowering of the signal level of the noise source net and analysis processing of determining whether or not a crosstalk error occurs in the noise source net of which the signal level is lowered. The processing are executed by the information processing apparatus. The reduction release processing restores, in at least one of the case in which the delay analyzing processing determines that the delay error does not occur in the path and the case in which the analysis processing determines that the crosstalk error does not occur, the signal level of the noise source net to an original signal level.

In the crosstalk error control program, the reducing processing provisionally changes a function block of the noise source net thus detected and lowers a signal level of the noise source net.

In the crosstalk error control program, the delay analyzing processing determines whether or not a delay value in the path of a net affected by the lowering of the signal level of the noise source net exceeds a predetermined delay limit value and determines, if the delay value of the path in the net exceeds the predetermined delay limit value, that a delay error has occurred in the path of the net.

Also in the crosstalk error control program, the crosstalk analyzing processing determines, if a value of a crosstalk quantity obtained by analyzing a net exceeds a predetermined crosstalk quantity limit value, that a crosstalk error has occurred in the net and detects a crosstalk error net in which the crosstalk error has occurred.

In the crosstalk error control program, the analysis processing determines, if a value of a crosstalk quantity obtained by analyzing a net does not exceeds a predetermined crosstalk quantity limit value, that a crosstalk error has not occurred in the net.

In accordance with the present invention, a crosstalk error net in which a crosstalk error has occurred is detected and then noise source nets being a noise source to the crosstalk error net are determined. By lowering a signal level of a noise source net, the crosstalk error of the crosstalk error net is suppressed. Therefore, even when the wiring is arranged at high density, the crosstalk error can be suppressed.

BRIEF DESCRIPTION OF THE DRAWINGS

The objects and features of the present invention will become more apparent from the consideration of the following detailed description taken in conjunction with the accompanying drawings in which.

DESCRIPTION OF THE EMBODIMENTS

Figure 1:
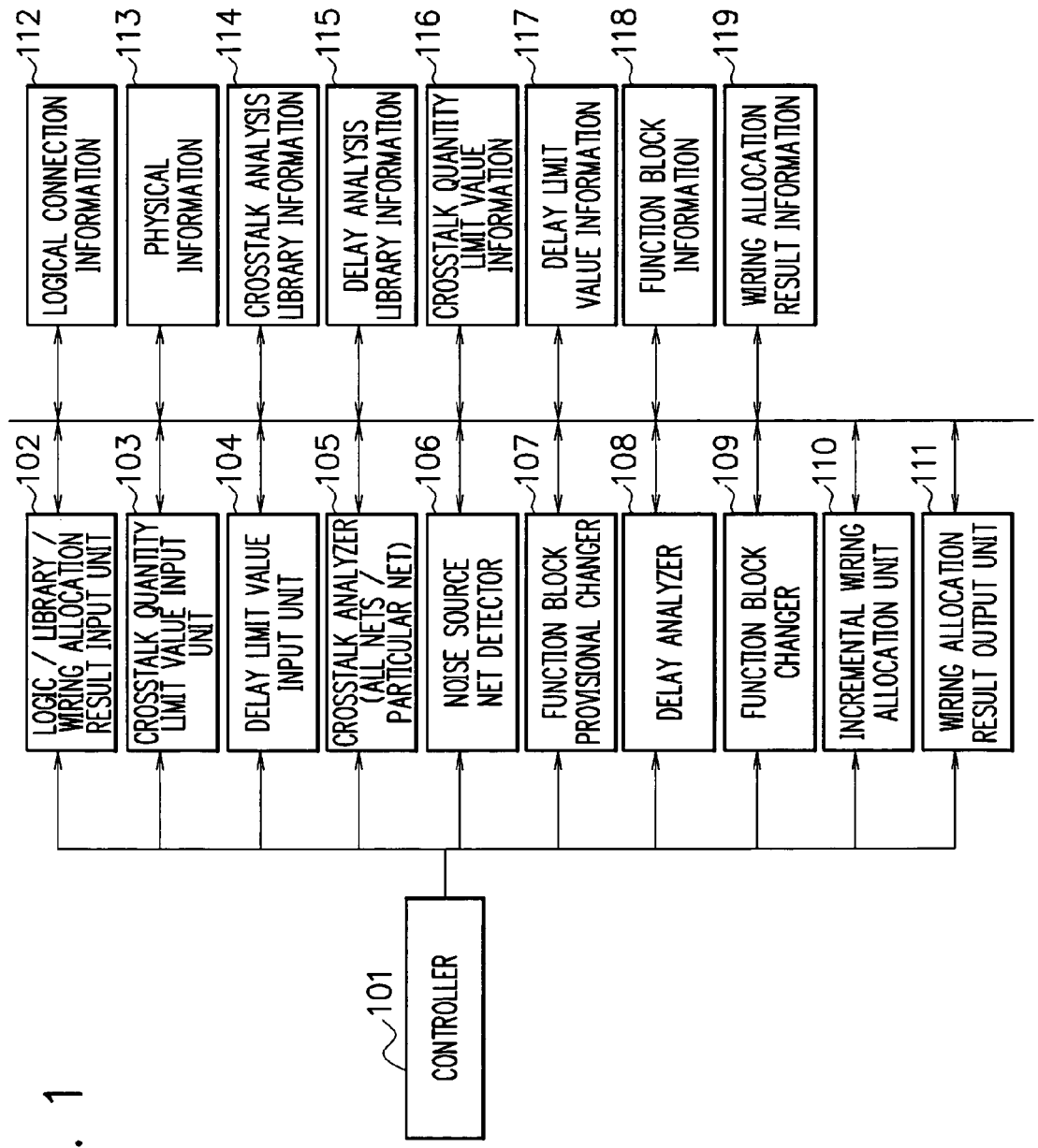
FIG. 1 is a schematic block diagram showing a configuration of an embodiment of a crosstalk error control apparatus.

Referring next to FIG. 1, description will be given of an embodiment of a crosstalk error control apparatus.

The crosstalk error controller of the embodiment includes at least a crosstalk analyzer 105 to detect a crosstalk error net in which a crosstalk error has occurred, a noise source net detector 106 to detect a noise source net which is a noise source of the crosstalk error net, and a function block provisional change unit (a voltage-drop unit to cause a voltage drop) 107 to lower a signal level of the noise source net to thereby suppress a crosstalk error in the crosstalk error net. As a result, even when the wiring is disposed at high density, the crosstalk error can be suppressed. Referring now to the accompanying drawings, description will be given of a crosstalk error controller of the embodiment.

Referring first to FIG. 1, description will be given of the crosstalk error controller of the embodiment. FIG. 1 shows a configuration of the crosstalk error control unit.

The crosstalk error control unit includes a controller 101, a logic/library/wiring allocation result input unit 102, a crosstalk quantity limit value input unit 103, a delay limit value input unit 104, a crosstalk analyzer 105, a noise source net detector 106, a function block provisional changer 107, a delay analyzer 108, a function block changer 109, an incremental wiring allocation unit 110, and a wiring allocation result output unit 111. The crosstalk error control unit thus configured handles logical connection information 112, physical information 113, crosstalk analysis library information 114, delay analysis library information 115, crosstalk quantity limit value information 116, delay limit value information 117, function block information 118, and wiring allocation result information 119.

Figure 2:
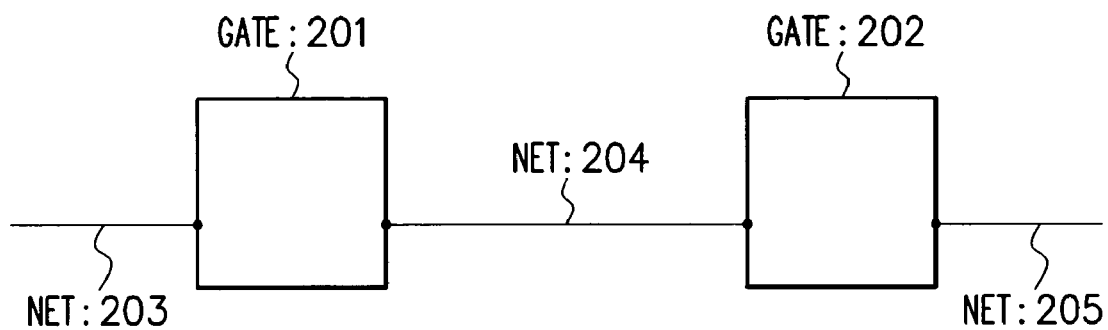
FIG. 2 is a first diagram to explain specific processing of the crosstalk error control apparatus shown in FIG. 1.
Figure 3:
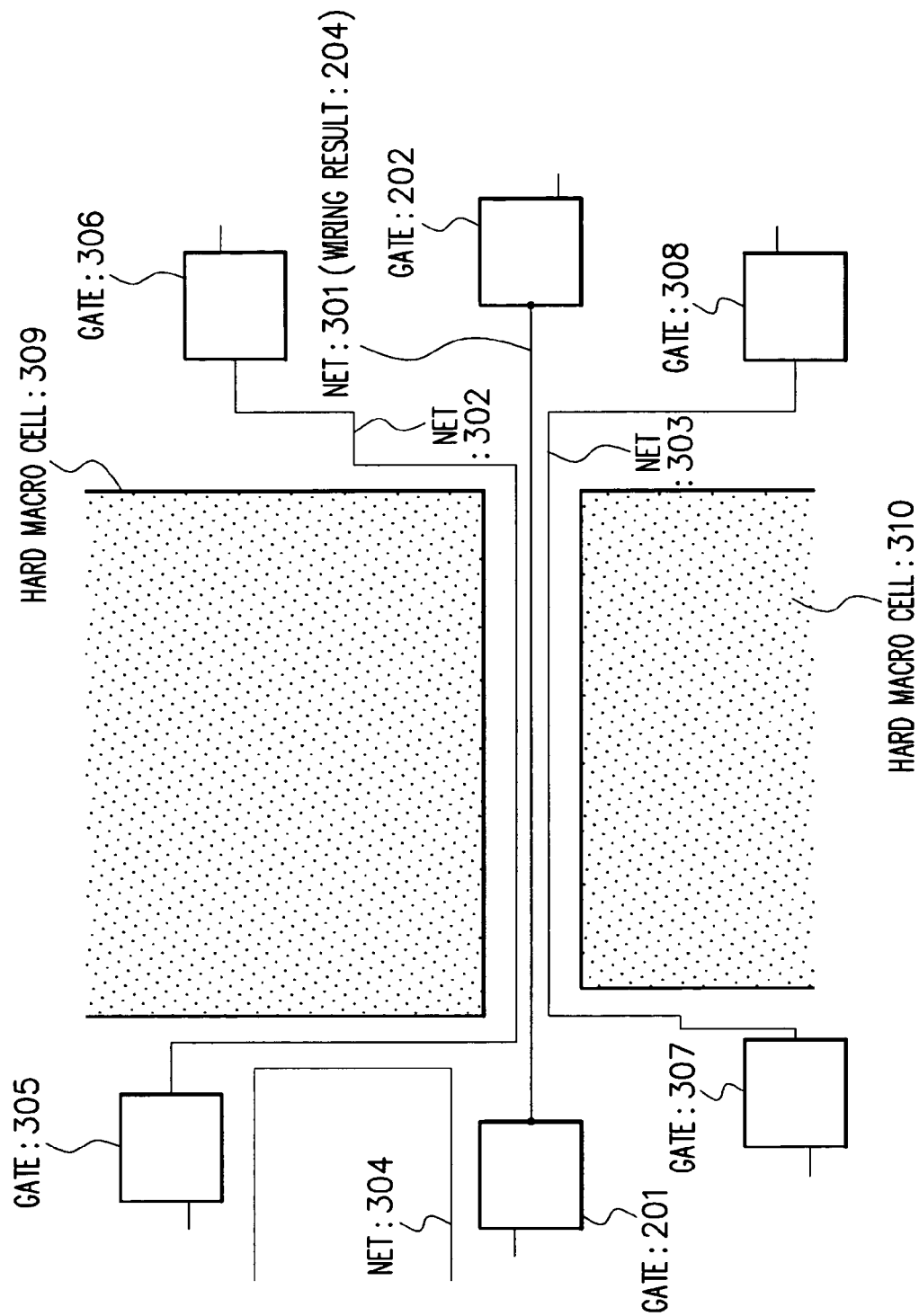
FIG. 3 is a second diagram to explain specific processing of the crosstalk error control apparatus shown in FIG. 1.

The logical connection information 112 is information indicating a relationship of logical connections between blocks, for example, information to indicate a logical connection relationship between gates 201 and 202 shown in FIG. 2. The physical information 115 is information indicating an allocated position allocated to each gate and wiring positions for connection between gates, for example, information to indicate allocated positions of gates and wiring positions of nets for connection between gates shown in FIG. 3. The crosstalk analysis library information 114 is employed for a crosstalk analysis. The delay analysis library information 115 is information for use in delay analysis processing. The crosstalk quantity limit value information 116 is utilized to detect a net in which a crosstalk error has taken place and indicates a crosstalk quantity limit value of each net of a logic circuit. The delay limit value information 117 is adopted to detect a net in which a delay error has occurred and designates a delay limit value of each path of a logic circuit. The function block information 118 is information to be used when a function block is changed. The wiring allocation result information 119 is employed to indicate a wiring result of a wiring arrangement designed in a layout, for example, as shown in FIG. 3.

The controller 101 comprehensively controls operation of the logic/library/wiring allocation result input module 102, the crosstalk quantity limit value input unit 103, the delay limit value input device 104, the crosstalk analyzer 105, the noise source net detecting module 106, the function block provisional changer 107, the delay analyzing unit 108, the function block changer 109, the incremental wiring allocation device 110, and the wiring allocation result output module 111.

The input module 102 is disposed to input the logical connection information 112, the physical information 113, the crosstalk analysis library information 114, the delay analysis library information 115, the function block information 118, and the wiring allocation result information 119.

The crosstalk quantity limit value input unit 103 is arranged to input the crosstalk quantity limit value information 116 indicating a crosstalk quantity limit value of each net.

The delay limit value input device 104 is adopted to input the delay limit value information 117 indicating a delay limit value of each path.

The crosstalk analyzer 105 calculates a crosstalk quantity by use of the library information 114 for each of the nets in the wiring allocation result information 119 supplied from the input module 102 or for a particular net. The analyzer 105 compares the calculated crosstalk quantity with crosstalk limit value information 116 fed from the crosstalk quantity limit value input device 103. According to a result of the comparison, the analyzer 105 detects a net in which a crosstalk error has occurred.

The noise source net detecting module 106 detects a noise source net acting as a noise source to the net in which the crosstalk error has occurred, the error being analyzed by the analyzer 105.

For the noise source net detected by the detecting unit 106, the function block provisional changer 107 selects, from the function block information delivered from the input module 102, a function block with a level shift suitable to suppress a crosstalk error. The detector 106 provisionally sets the selected function block as a function block constituting the noise source net.

The delay analyzer 108 calculates, using the delay analysis library information 115 supplied from the input module 102, path delay values for each of the paths in the result information 119 fed from the input module 102 or for a path passing through a particular net. The analyzer 108 compares the attained path delay value with the delay limit value information 117 fed from the delay value input module 103 to thereby detect a path in which a delay error has taken place.

The function block changer 109 determines whether the function block provisionally set by the provisional changer 107 is adopted as the functional block for subsequent operation or is released. For example, for paths including the noise source net in which the provisional changer 107 has provisionally set function blocks, paths including peripheral nets influenced by crosstalk noise from the noise source net, and the respective nets, the functional block changer 109 conducts an incremental delay analysis. If another delay error is detected as a result or if there exists a net in which another crosstalk error is detected as a result of an incremental crosstalk analysis by the crosstalk analyzer 105, the changer 109 releases the function block, which was provisionally set by the provisional changer 107. If any delay error is not detected as a result of the delay analysis and if there does not exist any net in which a crosstalk error is detected or the crosstalk quantity is reduced as a result of the crosstalk analysis, the changer 109 designates the function block provisionally set by the provisional changer 107 as a designated functional block for subsequent operations.

The incremental wiring assignment module 110 conducts a rewiring operation for nets linked with a non-provisional function block to be used in subsequent operations as a result of the processing by the changer 109. The module 110 also carries out rewiring for the change of other function blocks affected by the change of the function blocks and for wiring of nets associated therewith.

The wiring allocation result output module 111 updates the wiring allocation result information 119 supplied from the input unit 102 by reflecting a result of the re-wiring carried out by the change module 109 and the wiring allocation unit 110 and then delivers the wiring allocation result information 119 to an external device.

Figure 4:
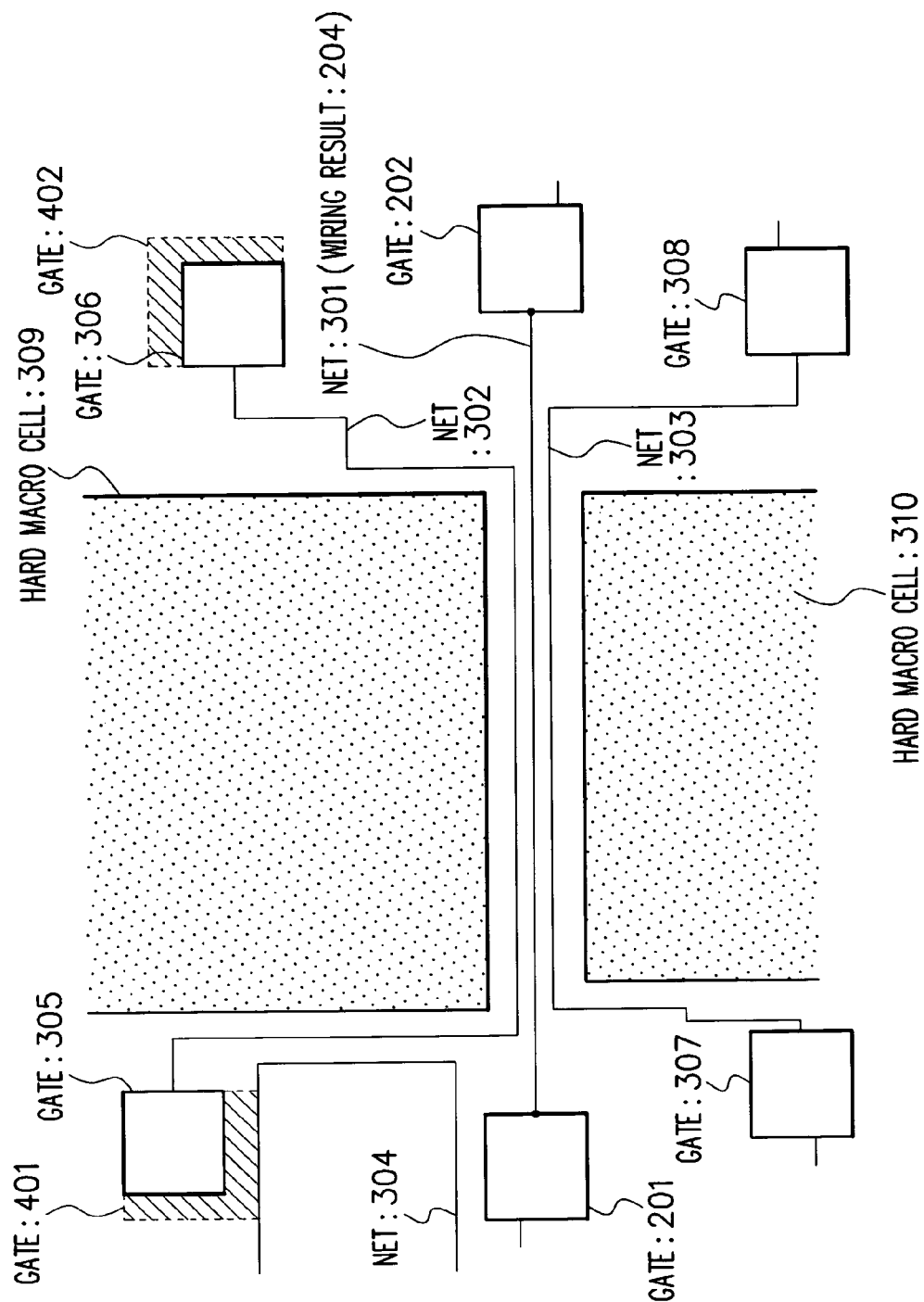
FIG. 4 is a third diagram to explain specific processing of the crosstalk error control apparatus shown in FIG. 1.
Figure 5:
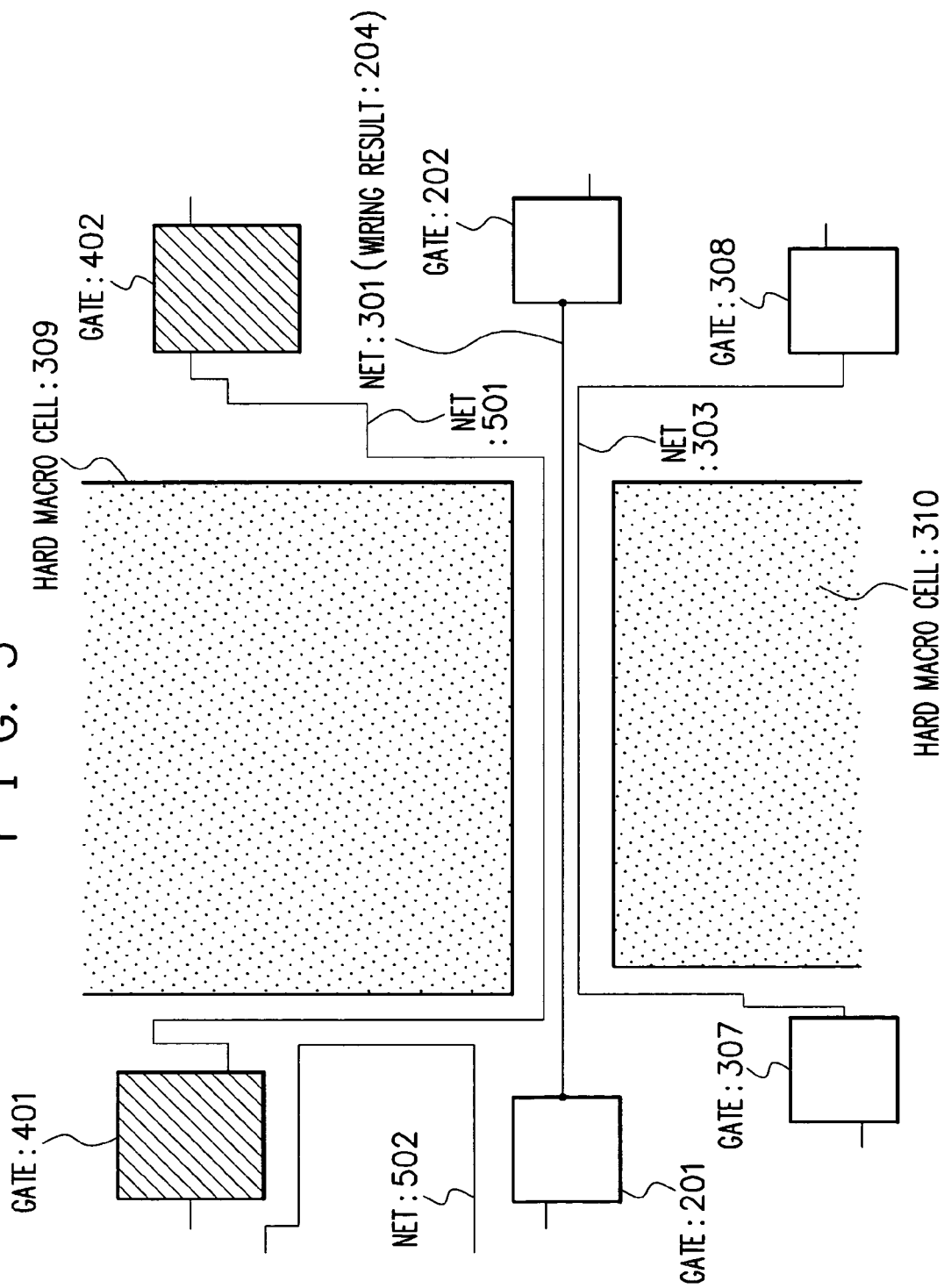
FIG. 5 is a fourth diagram to explain specific processing of the crosstalk error control apparatus shown in FIG. 1.
Figure 6:
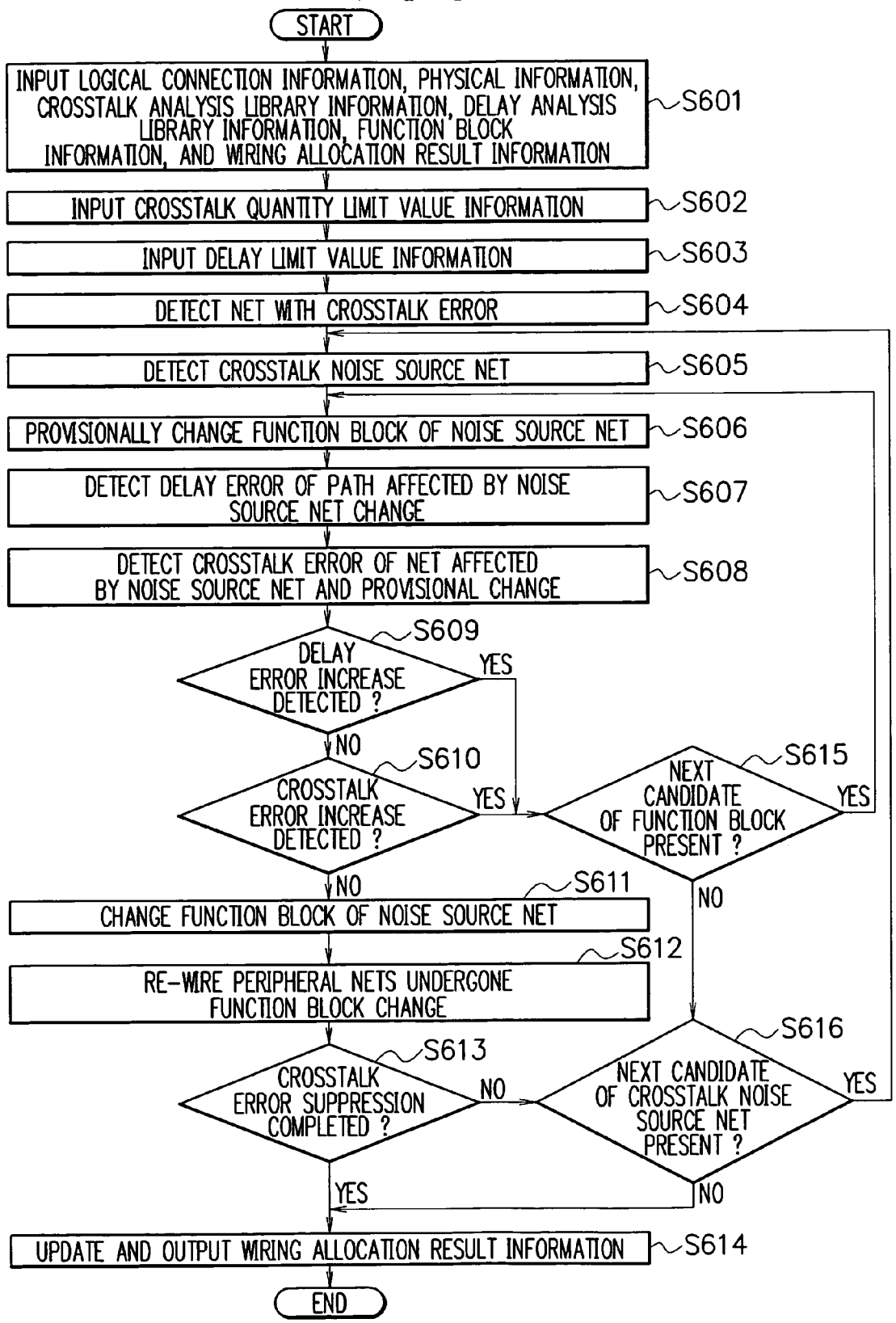
FIG. 6 is a flowchart showing control processing of the embodiment of the crosstalk control apparatus in the embodiment.

Referring next to FIGS. 2 to 6, description will be given of a control operation in the embodiment of the crosstalk error control unit. FIG. 6 shows a flowchart of the control operation in the embodiment. FIGS. 2 to 5 are circuit layouts to explain the control operation.

The crosstalk error control device of the embodiment operates under control of the controller 101 to achieve control operation. That is, the control device carries out the operation according to processing executed by the input module 102, the crosstalk quantity limit value input unit 103, the delay limit value input device 104, the crosstalk analyzer 105, the noise source net detector 106, the function block provisional changer 107, the delay analyzer 108, the function block changer 109, the incremental wiring allocation module 110, and the wiring allocation result output unit 111.

As a result, the crosstalk error control device carries out, as can be seen from FIG. 6, an information input step S601 to input the logical connection information 112, the physical information 113, the crosstalk analysis library information 114, the delay analysis library information 115, function block information 118, and wiring allocation result information 119; a crosstalk quantity limit value information input step S602 to receive the crosstalk quantity limit value information 116; a delay limit value information input step S603 to input the delay limit value information 117; a crosstalk error net detection step S604 to detect a net in which a crosstalk error has occurred; a noise source net detection step S605 to detect a noise source net that causes the crosstalk error in the net detected at step S604; a function block provisional change step S606 to provisionally change a function block of the noise source net; a noise source net delay error detection step S607 to detect a delay error in a path of a net affected by the change of the function block; and a noise source net crosstalk error detection step S608 to detect occurrence of crosstalk errors in the noise source net and in a net affected by the function block change of the noise source net. The crosstalk error control device also conducts a delay error detection determination step S609 to determine whether or not the noise source net delay error detection step has detected a path delay error, a crosstalk error detection determination step S610 to determine whether or not the noise source net crosstalk error detection step has detected occurrence of a crosstalk error, a function block change step S611 to change the function block of the noise source net, a changed block peripheral net re-wiring step S612 to re-wire the wiring arrangement in the periphery of the noise source net of which the function block has been changed, and a wiring allocation result information update and output step S614 to update and to output wiring allocation result information regarding the re-wiring of the wiring arrangement in the periphery of the noise source net. Next, description will be given in detail of the control operation of the crosstalk error control device. Specifically, description will be given of an example of control operation to suppress a crosstalk error in a part of a logical connection relationship between a block of a gate 201, a block of a gate 202, and nets 203 to 205 connected to the blocks 201 and 202 as shown in FIG. 2. FIG. 2 shows wiring pattern allocation of only part of the logical connection relationship. However, in actual wiring pattern allocation, wiring patterns are allocated for the entire logical connection relationship.

The input module 102 first receives the logical connection information 112 indicating a relationship of logical connections between gates, the physical information 113 designating information of allocation of gates and information of wiring for connections between gates, the crosstalk analysis library information 114 for the crosstalk analysis, the delay analysis library information 115 for the delay analysis, the function block information 118 to change a function block, and the wiring allocation result information 119 indicating a result of allocation of wiring for gates (step 601). Each of the information item received in step S601 is referred to and/or is updated by the modules 101 to 111 shown in FIG. 1.

According to the logical connection information 112 and the physical information 113 supplied from the input module 102, the controller 101 executes processing to wire the wiring pattern for the blocks respectively of the gates 201 and 202 to attain a wiring pattern allocation result as shown in FIG. 3.

Specifically, on the basis of the information 112, the controller 101 assumes that the gate 201 is linked with the gate 202, a gate 305 is coupled with a gate 306, and a gate 307 is connected to a gate 308 as shown in FIG. 3.

Also, the control module 101 assumes, according to the information 113, that the nets 204, 302, and 303 are allocated between the hard macro cells 309 and 310, the net 301 connects the gate 201 to the gate 202, the net 302 links the gate 305 with the gate 306, the net 303 couples the gate 307 with the gate 308, and the net 304 is allocated between the gate 305 and the gate 201.

The crosstalk quantity limit value input module 103 receives the crosstalk quantity limit value information 116 denoting a limit value of the crosstalk quantity of each net (step 602).

The delay limit value input unit 104 receives the delay limit value information 117 indicating a path delay limit value of each net (step 603).

According to the crosstalk analysis library information 114 delivered from the input device 102, the crosstalk analyzer 105 executes crosstalk analysis processing for each net to resultantly detect a net in which a crosstalk error has occurred (step 604).

For example, the analyzer 105 carries out a crosstalk analysis for a net shown in FIG. 3 according to the library information 114 to produce a value of the crosstalk quantity for the net. The analyzer 105 makes a check to determine whether or not the value exceeds a crosstalk quantity limit value indicated by the information 116 supplied from the limit value input module 103. If it is determined that the limit value is exceeded, the crosstalk analyzer 105 determines that a crosstalk has taken place in the pertinent net. Otherwise, the analyzer 105 determines that a crosstalk has not occurred in the pertinent net. As above, the analyzing module 105 detects a net with a crosstalk error.

The crosstalk quantity VN of a net N is represented by a sum of crosstalk noise quantities (Zj) between a net N and a net j adjacent thereto (j indicating a plurality of nets; the sign of a sum, i.e. Σ indicates a sum of values with respect to j).

$$VN = \Sigma Zj \tag{1}$$

The crosstalk quantity Zj between a net N and a net j adjacent thereto is expressed by a function f(x) which monotonously increases with respect to inter-wiring capacity Cj between the net N and the adjacent net j and with respect to a voltage level Vj of the net j as indicated by expression (2).

$$Zj = f(Vj, Cj) \quad (2)$$

The inter-wiring capacity Cj between the net N and the adjacent net j is represented by a function g(x) monotonously decreasing with respect to distance Wj between the net N and the adjacent net j as indicated by expression (3).

$$Cj = g(Wj) \quad (3)$$

Therefore, to lower the crosstalk quantity of the net N, it is required that the distance between the net N and the adjacent net j be elongated and the voltage level Vj of the adjacent net j be reduced.

In the calculation of the crosstalk noise quantity of the net 301 in the layout of FIG. 3, since the wiring passes between the hard macro cells 309 and 310, the wiring density is high and it is difficult to increase the distance Wj between the adjacent wiring lines 302 and 303 leading to occurrence of a crosstalk. Therefore, to reduce the crosstalk quantity of the net N, the crosstalk error control apparatus lowers the voltage level Vj of the adjacent net j.

To simplify the above description, the function f(x) of expression (2) and the function g(x) of expression (3) are replaced by simple, approximate expressions as below.

$$f(Vj, Cj) = \beta \cdot Vj \cdot Cj \text{ ($\beta$ is a positive coefficient)}$$

$$g(Wj) = \gamma / Wj \text{ ($\gamma$ is a positive coefficient)}$$

That is, expression (2) is converted into expression (4) as follows:

$$Zj = \beta \cdot Vj \cdot Cj. \quad (4)$$

Expression (3) is represented as follows:

$$Cj = \gamma / Wj. \quad (5)$$

This means that Zj is in proportion to Vj and Cj according to expression (4) and Cj is inversely in proportion to Wj according to expression (5).

VN indicating the crosstalk quantity is expressed as follows by assigning expressions (4) and (5) to expression (1):

$$VN = \Sigma Zj = \Sigma(\beta Vj \cdot Cj) = \Sigma(\beta \cdot Vj \cdot \gamma / Wj) = \Sigma(\beta \cdot \gamma \cdot Vj / Wj) = \alpha \Sigma (Vj/Wj) \quad (6)$$

where, $\alpha$ is a positive coefficient satisfying a relationship of $\alpha = \beta \cdot \gamma$.

Assume that a crosstalk quantity V302 which the net 301 receives from the adjacent wiring 302 is $30\alpha V/W$ and a crosstalk quantity V303 which the net 301 receives from the adjacent wiring 303 is $25\alpha V/W$. Then, a crosstalk noise quantity V301 received by the net 301 is a sum of the crosstalk quantities from the adjacent wiring lines 302 and 303:

$$V301 = V302 + V303 = 30\alpha V/W + 25\alpha V/W = 55\alpha V/W$$

where V is a unit voltage of the voltage level Vj and W is a unit length of the distance Wj.

Assume that the crosstalk quantity limit value of the net 301 indicated by the crosstalk quantity limit value information 116 supplied from the input module 103 is $50\alpha V/W$. Since the crosstalk noise quantity ($V301 = 55\alpha V/W$) received by the net 301 is more than the crosstalk quantity limit value of the net 301 indicated by the limit value information 116 ($55\alpha V/W > 50\alpha V/W$), the crosstalk analyzer 105 determines that a crosstalk error has occurred in the net 301.

Therefore, for the layout shown in FIG. 3, the crosstalk analyzing module 105 detects the net 301 as a net in which a crosstalk error has taken place.

Among the noise source nets (breeding a crosstalk error) to the net 301 specified by the crosstalk analyzer 105, the noise source net detector 106 detects a noise source net having a highest value of the crosstalk quantity (step 605).

For example, in the case of the layout of FIG. 3, the detector 106 detects, as the noise source net of a crosstalk error at the net 301, a net 302 of which the crosstalk quantity takes a value of $30\alpha V/W$ and a net 303 of which the crosstalk quantity takes a value of $25\alpha V/W$. Since $30\alpha V/W > 25\alpha V/W$, the detector 106 detects the net 302 as a net having a highest value of the crosstalk quantity among the noise source nets.

Thereafter, for a driver and a receiver of the net 302 which has the highest crosstalk quantity and which was detected by the noise source net detector 106, the function block provisional changer 107 selects, according to a function block type (designating a function name of a function block) contained in the function block information 118, a function block that most reduces the voltage level associated with the function block type and a function block that restores the voltage to the original voltage level after the reduction thereof. The provisional changer 107 provisionally sets the function blocks respectively to the driver and the receiver of the net 302 of the highest crosstalk quantity (step 606). As one type of the function block, it is also possible to lower the voltage level by inserting a terminator in series with the driver.

For example, for the layout of FIG. 3, the provisional changing module 107 temporarily replaces the driver, i.e., the gate 305 and the receiver, i.e., the gate 306 of the net 302 of the highest crosstalk quantity among the noise source nets to the net 301 with the function blocks selected using the function block information 118. Specifically, as can be seen from FIG. 4, there are provisionally employed a gate 401 as a driver, i.e., a function block with a level shift to shift the level of the gate 305 (a driver of the net 302) by 20% and a gate 402 as a receiver, i.e., a function block with a level shift to shift the level of the gate 306 (a driver of the net 302) by 20%.

For all paths that pass through the nets affected by the provisional change for the net 302 of the highest crosstalk quantity by the provisional changer 107, the delay analyzer 108 incrementally executes delay analysis processing on the basis of the delay analysis library information 115 to calculate a delay value of the path. The provisional changer 107 determines whether or not the value exceeds the delay limit value indicated by the delay limit value information 117 fed from the input module 103. If the delay value exceeds the delay limit value, the provisional changing module 107 determines that a delay error has occurred in the net thus analyzed. Otherwise, the provisional changer 107 determines that any delay error has not occurred in the net. The delay analyzer 108 then detects, from all nets affected by the provisional change, nets in which a delay error has occurred (step 607).

The crosstalk analyzer 105 then executes crosstalk error detection processing for the noise source net 302 at which the provisional change was conducted by the function block provisional changer 107 and for all nets affected by the provisional change of the noise source net 302 (step 608).

For the noise source net 302 and for each net affected by the provisional change, the crosstalk analyzer 105 executes incremental crosstalk processing on the basis of the library information 114 to determine whether or not a value of the crosstalk quantity thus analyzed exceeds the crosstalk limit value indicated by the limit value information 114 fed from the input unit 103. If the value exceeds the limit value, the analyzer 105 assumes that a crosstalk error has occurred. Otherwise, the analyzer 105 assumes that any crosstalk error has not occurred. In this manner, the analyzer 105 executes the crosstalk error detection processing for the noise source net 302 and each net affected by the provisional change of the net 302.

If it is determined in step S607 that the delay analyzing unit 108 has detected a net with a delay error among the nets affected by the function block change of the noise source net 302 (yes in step S609) or if it is determined in step S608 that the crosstalk analyzer 105 has detected a net with a crosstalk error among the nets including the noise source net 302 having undergone the provisional change and those affected by the provisional change of the noise source net 302 (yes in step S610), the function block changing unit 109 releases the provisional function block change for the net 302.

The function block changer 109 makes a check to determine whether or not a candidate exists for another function block type (step S615). If such a candidate is present (yes in step S615), the provisional changing module 107 selects again a function block type from the function block types excepting the function block type for which the release processing is executed as above. On the basis of the selected function block type, the provisional changer 107 temporarily changes the function block for the noise source net 302 (step S606) to execute again the processing of steps S607 to S610.

If there does not exist such a function block candidate (no in step S615), the changing unit 109 makes a check to determine presence or absence of a noise source net other than the net 302 among the noise source nets against the net 301 (step S616). If it is determined that such a noise source net is present (yes in step S616), the noise source net detector 106 selects a second noise source net with the highest crosstalk quantity excepting the net 302 (step S605). According to the second noise source net, the processing of steps S606 to S610 is executed again.

If the delay analyzer 108 does not detect, from the nets affected by the function block change of the noise source net 302 in step S607, any net with a delay error (no in step S609) and the crosstalk analyzer 105 does not detect in step S608 any net with a crosstalk error among the nets including the noise source net 302 and those affected by the provisional change of the net 302 (no in step S610), the function block changer 109 decides that the function block temporarily set by the provisional changer 107 is the final choice (step S611).

For example, for the noise source nets among the net 301 with a crosstalk error in the layout shown in FIG. 4, the function block changer 109 replaces the gate 305 (a driver) and the gate 306 (a receiver) of the net 302 by the gate 401 (a driver) and the gate 402 (a receiver) which are function blocks temporarily changed by the provisional changer 107.

Subsequently, the incremental wiring module 110 rewires peripheral nets affected by the change of the function blocks by the changer 109 (step S612) to obtain the suppressed crosstalk error.

For example, the incremental wiring module 110 replaces the noise source net 302 by a net 501 and replaces the peripheral net 304 by a net 502.

In this fashion, the module 110 executes incremental wiring processing (the function block change and the wiring of the associated net based on an actual wiring allocation result) for the initial layout result.

Then it is determined whether or not the suppression of the crosstalk error has been completed (step S613). If the suppression has not been finished for the net 301 (no in step S613), it is determined whether or not a noise source net other than the net 302 exists around the net 301 (step S616). If such a noise source is present (yes in step S616), the noise source net detector 106 selects a second noise source net having the highest crosstalk quantity excepting the net 302 (step S605). On the basis of the second noise source net, the detector 106 executes again the processing of steps S606 to S612.

As a result, even after the change of the function block of the noise source net 302, where a crosstalk error is detected in the net 301 and it is determined that the crosstalk error suppression has not been completed, there is selected a second noise source net having the highest crosstalk quantity excepting the net 302 (step S605). According to the second noise source net, the processing of steps S606 to S612 is executed again.

Through the above processing, the crosstalk quantity V501 of the net 501 implemented by changing the function block of the noise source net 302 and the crosstalk quantity V301 of the net 301 are attained as below using, for example, the result of the function block change shown in FIG. 5, i.e., the gate 401 (a driver), i.e., a function block with a level shift to shift the level of the gate 305 (a driver of the net 302) by 20% and a gate 402 (a receiver), i.e., a function block with a level shift to shift the level of the gate 306 (a driver of the net 302) by 20%.

$$V501 = 30 \cdot (1-0.2) \cdot V/W = 24 \cdot V/W$$

$$V301 = V501 + V303 = 24\alpha V/W + 25\alpha V/W = 49\alpha V/W$$

Since the crosstalk quantity V501 of the net 501 is less than the crosstalk quantity V302 of the net 302, the crosstalk quantity V301 of the net 301 is less than the crosstalk quantity limit value 50αV/W to resultantly suppress the crosstalk error. Even when the crosstalk error cannot be suppressed by use of the crosstalk quantity V501 of the net 501, it is possible to execute processing for the net 303 in a similar way as for the net 302 to provisionally change a function block to thereby reduce the crosstalk quantity V303 of the net 303. This further suppresses the crosstalk quantity V301 of the net 301 to a value less than the crosstalk quantity limit value.

Finally, if the crosstalk error suppression has been completed for the net 301 with a crosstalk error (yes in step S613), the wiring allocation result output module 111 updates the wiring allocation result information 119 fed from the input module 102 by reflecting the result of the re-wiring through the change of the function blocks by the function block changer 109 (to attain the result) to resultantly feed the updated wiring allocation result information 119 to an external device (step S611).

As above, in the crosstalk error controller of the embodiment, the crosstalk analyzer 105 detects a net with a crosstalk error (step S604) and the noise source net detector 106 detects a noise source net acting as a noise source to the net. From the noise source nets thus detected, the detector 106 selects a noise source net having the highest noise quantity (step S605). The function block provisional changer 107 temporarily changes a function block of the noise source net selected by the detector 106 to lower a signal level of the noise source net (step S606). The delay analyzer 108 makes a check to determine that a delay error does not occur in any path passing through a net affected by the lowering of the signal level of the noise source net for which the function block has been provisionally changed (step S609). The crosstalk analyzer 105 confirms that a crosstalk error does not occur in the noise source net for which the provisional change has been conducted (step S610). The function block changer 109 makes provisional changes final (step S611). The incremental wiring allocation module 110 conducts fine adjustments of the re-wiring associated with finality of the functional block change (step S612) to thereby obtain a wiring result in which the crosstalk error is suppressed or is desirably removed.

In the crosstalk error controller of the embodiment, the suppression control to attain the wiring result in which the crosstalk error is suppressed includes only two processing, i.e., processing to change a function block of a noise source net and fine wiring processing in the periphery of the function block thus changed. It is hence possible to reduce the quantity of changes that is needed to suppress the crosstalk error. Therefore, even when the wiring density is high, the crosstalk error suppression can be controlled for the following reason.

That is, in a case in which it is desired to improve the crosstalk error only by modifying the wiring of a net, when the net has long wiring, the crosstalk error cannot be sufficiently removed or suppressed depending on the density of lines. However, since the crosstalk error controller of the embodiment executes the function block change processing for the driver and the receiver, the crosstalk error can be suppressed without changing the wiring pattern in the densely wired area.

The crosstalk error controller of the embodiment executes the incremental re-wiring processing (processing to change function blocks according to information of an actual wiring allocation result and processing to fine re-wiring associated with the function block change) for the initial layout result (the layout result according to the conventional method). This makes it possible to reduce the period of time required to suppress the crosstalk error. In the function block change processing, occurrence of a crosstalk error and a delay error has been determined. Therefore, it is possible to reduce occurrence of another crosstalk or delay error.

The embodiment described above is an embodiment suitable for the present invention. The present invention is not restricted by the embodiment. The embodiment can be changed or modified in various fashions without departing from the scope and spirit of the present invention. For example, the control processing of the crosstalk error controller of the embodiment may also be implemented by a computer program. The program may be recorded in a recording medium such as an optical recording medium, a magnetic recording medium, a magnetooptical recording medium, or a semiconductor storage medium such that the program is read from the recording medium to be loaded into an information processing apparatus to be executed therein. The program may also be obtained via a network from an external device and is installed in an information processor for execution thereof.

The crosstalk error controller in accordance with the present invention is applicable to the designing of layouts of logical circuits or layouts of logical connection relationships between the logical circuits such as a LargeScale Integrated (LSI) circuit and a Printed Wiring Board (PWB) by using a Computer Aided Design (CAD).

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A crosstalk error control apparatus, comprising:
   crosstalk analyzing unit for detecting a crosstalk error net in which a crosstalk error has occurred;
   noise source detecting unit for detecting noise source nets being noise sources to the crosstalk error net;
   reducing unit for lowering a signal level of a noise source net at the signal source, thereby suppressing the crosstalk error in the crosstalk error net;
   wiring allocation unit for executing re-wiring processing in a periphery of the noise source net of which the signal level is lowered by the reducing unit;
   delay analyzing unit for determining whether or not a delay error occurs in a path of a net affected by the lowering of the signal level of the noise source net; and
   analysis unit for determining whether or not a crosstalk error occurs in the noise source net of which the signal level is lowered, wherein the wiring allocation unit executes, if the delay analyzing unit determined that the delay error has not occurred in the path and the analysis unit determines that the crosstalk error has not occurred, the re-wiring processing in a periphery of the noise source net of which the signal level is lowered.

2. A crosstalk error control apparatus in accordance with claim 1, wherein the noise source net detecting unit detects the noise source nets in a descending order of noise quantities.

3. A crosstalk error control apparatus in accordance with claim 1, wherein the delay analyzing unit determines whether or not a delay value in the path of a net affected by the lowering of the signal level of the noise source net exceeds a predetermined delay limit value and determines, if it is determined that the delay value of the path in the net exceeds the predetermined delay limit value, that a delay error has occurred in the path of the net.

4. A crosstalk error control apparatus in accordance with claim 1, wherein the analysis unit determines, if a value of a crosstalk quantity obtained by analyzing a net does not exceeds a predetermined crosstalk quantity limit value, that a crosstalk error has not occurred in the net.

5. A crosstalk error control apparatus in accordance with claim 1, further comprising release unit for restoring to an original signal level the signal level of the noise source net lowered by the reducing unit.

6. A crosstalk error control apparatus in accordance with claim 5, further comprising:
   delay analyzing unit for determining whether or not a delay error occurs in a path of a net affected by the lowering of the signal level of the noise source net; and
   analysis unit for determining whether or not a crosstalk error occurs in the noise source net of which the signal level is lowered, wherein
   the release unit restores, in at least one of the case in which the delay analyzing unit determines that the delay error does not occur in the path and the case in which the analysis unit determines that the crosstalk error does not occur, the signal level of the noise source net to an original signal level.

7. A crosstalk error control apparatus in accordance with claim 6, wherein the delay analyzing unit determines whether or not a delay value in the path of a net affected by the lowering of the signal level of the noise source net exceeds a predetermined delay limit value and determines, if it is determined that the delay value of the path in the net exceeds the predetermined delay limit value, that a delay error has occurred in the path of the net.

8. A crosstalk error control apparatus in accordance with claim 6, wherein the analysis unit determines, if a value of a crosstalk quantity obtained by analyzing a net does not exceeds a predetermined crosstalk quantity limit value, that a crosstalk error has not occurred in the net.

9. A crosstalk error control apparatus in accordance with claim 1, wherein the reducing unit provisionally changes a function block of the noise source net thus detected and lowers a signal level of the noise source net.

10. A crosstalk error control apparatus in accordance with claim 1, wherein the crosstalk analyzing unit determines, if a value of a crosstalk quantity obtained by analyzing a net exceeds a predetermined crosstalk quantity limit value, that a crosstalk error has occurred in the net and detects a crosstalk error net in which the crosstalk error has occurred.

11. A crosstalk error control method for use with an information processing apparatus controlling a crosstalk error, comprising:
   a crosstalk analyzing step of detecting a crosstalk error net in which a crosstalk error has occurred;
   a noise source detecting step of detecting noise source nets being noise sources to the crosstalk error net;
   a reducing step of lowering a signal level of a noise source net at the signal source, the steps being executed by the information processing apparatus to thereby suppress the crosstalk error in the crosstalk error net;
   a wiring allocation step for executing re-wiring processing in a periphery of the noise source net of which the signal level is lowered by the reducing step;
   a delay analyzing step of determining whether or not a delay error occurs in a path of a net affected by the lowering of the signal level of the noise source net; and
   an analysis unit step of determining whether or not a crosstalk error occurs in the noise source net of which the signal level is lowered, the steps being executed by the information processing apparatus, wherein the wiring allocation step executes, if the delay analyzing step determins that the delay error has not occurred in the path and the analysis step determines that the crosstalk error has not occurred, the re-wiring processing in a periphery of the noise source net of which the signal level is lowered.

12. A crosstalk error control method in accordance with claim 11, wherein in the noise source net detecting step noise source nets are detected in a descending order of noise quantities.

13. A crosstalk error control method in accordance with claim 11, wherein the delay analyzing step determines whether or not a delay value in the path of a net affected by the lowering of the signal level of the noise source net exceeds a predetermined delay limit value and determines, if the delay value of the path in the net exceeds the predetermined delay limit value, that a delay error has occurred in the path of the net.

14. A crosstalk error control method in accordance with claim 11, wherein the analysis step determines, if a value of a crosstalk quantity obtained by analyzing a net does not exceeds a predetermined crosstalk quantity limit value, that a crosstalk error has not occurred in the net.

15. A crosstalk error control method in accordance with claim 11, further comprising a release step of restoring to an original signal level the signal level of the noise source net lowered by the reducing step.

16. A crosstalk error control method in accordance with claim 15, further comprising:

a delay analyzing step of determining whether or not a delay error occurs in a path of a net affected by the lowering of the signal level of the noise source net; and
   an analysis step of determining whether or not a crosstalk error occurs in the noise source net of which the signal level is lowered, the steps being executed by the information processing apparatus, wherein
   the release step restores, in at least one of the case in which the delay analyzing step determines that the delay error does not occur in the path and the case in which the analysis step determines that the crosstalk error does not occur, the signal level of the noise source net to an original signal level.

17. A crosstalk error control method in accordance with claim 16, wherein the delay analyzing step determines whether or not a delay value in the path of a net affected by the lowering of the signal level of the noise source net exceeds a predetermined delay limit value and determines, if the delay value of the path in the net exceeds the predetermined delay limit value, that a delay error has occurred in the path of the net.

18. A crosstalk error control method in accordance with claim 16, wherein the analysis step determines, if a value of a crosstalk quantity obtained by analyzing a net does not exceeds a predetermined crosstalk quantity limit value, that a crosstalk error has not occurred in the net.

19. A crosstalk error control method in accordance with claim 11, wherein the reducing step provisionally changes a function block of the noise source net thus detected and lowers a signal level of the noise source net.

20. A crosstalk error control method in accordance with claim 11, wherein the crosstalk analyzing step determines, if a value of a crosstalk quantity obtained by analyzing a net exceeds a predetermined crosstalk quantity limit value, that a crosstalk error has occurred in the net and detects a crosstalk error net in which the crosstalk error has occurred.

21. A crosstalk error control program product embodied on a computer-readable medium and comprising code that, when executed, causes an information processing apparatus controlling a crosstalk error to perform the following:
   crosstalk analyzing processing for detecting a crosstalk error net in which a crosstalk error has occurred;
   noise source detecting processing for detecting noise source nets being noise sources to the crosstalk error net;
   reducing processing for lowering a signal level of a noise source net at the signal source to thereby suppress the crosstalk error in the crosstalk error net;
   wiring allocation processing of executing re-wiring processing in a periphery of the noise source net of which the signal level is lowered by the reducing step, the wiring allocation processing being executed by the information processing apparatus;
   delay analyzing processing of determining whether or not a delay error occurs in a path of a net affected by the lowering of the signal level of the noise source net; and
   analysis processing of determining whether or not a crosstalk error occurs in the noise source net of which the signal level is lowered, the processing being executed by the information processing apparatus, wherein the wiring allocation processing executes, if the delay analyzing processing determines that the delay error has not occurred in the path and the analysis processing determines that the crosstalk error has not occurred, the re-wiring processing in a periphery of the noise source net of which the signal level is lowered.

22. A crosstalk error control program in accordance with claim 21, wherein the noise source net detecting processing detects the noise source nets in a descending order of noise quantities.

23. A crosstalk error control program in accordance with claim 21, wherein the delay analyzing processing determines whether or not a delay value in the path of a net affected by the lowering of the signal level of the noise source net exceeds a predetermined delay limit value and determines, if the delay value of the path in the net exceeds the predetermined delay limit value, that a delay error has occurred in the path of the net.

24. A crosstalk error control program in accordance with claim 21, wherein the analysis processing determines, if a value of a crosstalk quantity obtained by analyzing a net does not exceeds a predetermined crosstalk quantity limit value, that a crosstalk error has not occurred in the net.

25. A crosstalk error control program in accordance with claim 21, further comprising reduction release processing for restoring to an original signal level the signal level of the noise source net lowered by the reducing processing.

26. A crosstalk error control program in accordance with claim 25, further comprising:
delay analyzing processing of determining whether or not a delay error occurs in a path of a net affected by the lowering of the signal level of the noise source net; and
analysis processing of determining whether or not a crosstalk error occurs in the noise source net of which the signal level is lowered, the processing being executed by the information processing apparatus, wherein
the reduction release processing restores, in at least one of the case in which the delay analyzing processing determines that the delay error does not occur in the path and the case in which the analysis processing determines that the crosstalk error does not occur, the signal level of the noise source net to an original signal level.

27. A crosstalk error control program in accordance with claim 26, wherein the delay analyzing processing determines whether or not a delay value in the path of a net affected by the lowering of the signal level of the noise source net exceeds a predetermined delay limit value and determines, if the delay value of the path in the net exceeds the predetermined delay limit value, that a delay error has occurred in the path of the net.

28. A crosstalk error control program in accordance with claim 26, wherein the analysis processing determines, if a value of a crosstalk quantity obtained by analyzing a net does not exceeds a predetermined crosstalk quantity limit value, that a crosstalk error has not occurred in the net.

29. A crosstalk error control program in accordance with claim 21, wherein the reducing processing provisionally changes a function block of the noise source net thus detected and lowers a signal level of the noise source net.

30. A crosstalk error control program in accordance with claim 21, wherein the crosstalk analyzing processing determines, if a value of a crosstalk quantity obtained by analyzing a net exceeds a predetermined crosstalk quantity limit value, that a crosstalk error has occurred in the net and detects a crosstalk error net in which the crosstalk error has occurred.

* * * * *

UNITED STATES PATENT AND TRADEMARK OFFICE
CERTIFICATE OF CORRECTION

PATENT NO.        : 7,367,004 B2
APPLICATION NO.   : 11/368467
DATED             : April 29, 2008
INVENTOR(S)       : Shinichi Katou It is certified that error appears in the above-identified patent and that said Letters Patent is hereby corrected as shown below:

Claim 17, Line 2 delete "claim 16" and insert -- claim 13 --

Claim 19, Line 2 delete "claim 11" and insert -- claim 13 --

Claim 27, Line 2 delete "claim 26" and insert -- claim 25 --

Claim 29, Line 2 delete "claim 21" and insert -- claim 25 --

Signed and Sealed this

Twenty-first Day of July, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,367,004 B2  Page 1 of 1
APPLICATION NO. : 11/368467
DATED : April 29, 2008
INVENTOR(S) : Shinichi Katou It is certified that error appears in the above-identified patent and that said Letters Patent is hereby corrected as shown below:

Column 18, Claim 17, Line 15 delete "claim 16" and insert -- claim 13 --

Column 18, Claim 19, Line 28 delete "claim 11" and insert -- claim 13 --

Column 20, Claim 27, Line 6 delete "claim 26" and insert -- claim 25 --

Column 20, Claim 29, Line 21 delete "claim 21" and insert -- claim 25 --

This certificate supersedes the Certificate of Correction issued July 21, 2009.

Signed and Sealed this

Eighteenth Day of August, 2009

David J. Kappos
*Director of the United States Patent and Trademark Office*